(12) United States Patent
Lu et al.

(10) Patent No.: US 6,482,331 B2
(45) Date of Patent: Nov. 19, 2002

(54) METHOD FOR PREVENTING CONTAMINATION IN A PLASMA PROCESS CHAMBER

(75) Inventors: Kuo-Liang Lu, Hsin-Chu (TW); Yung-Chih Yao, Miao-Li-Xuan (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 42 days.

(21) Appl. No.: 09/837,125

(22) Filed: Apr. 18, 2001

(65) Prior Publication Data

US 2002/0153350 A1 Oct. 24, 2002

(51) Int. Cl.$^7$ .............................. C23F 1/00; H01L 21/00; C23C 16/00
(52) U.S. Cl. ........................................ 216/67; 438/710
(58) Field of Search ........................... 216/67; 438/710; 156/345.37

(56) References Cited

U.S. PATENT DOCUMENTS

| | | | | |
|---|---|---|---|---|
| 4,901,667 A | * | 2/1990 | Suzuki et al. | 118/719 |
| 5,403,434 A | * | 4/1995 | Moslehi | 156/345.35 |
| 5,685,942 A | * | 11/1997 | Ishii | 156/345.48 |
| 5,690,050 A | * | 11/1997 | Doi | 118/723 MP |
| 5,824,607 A | * | 10/1998 | Trow et al. | 438/732 |
| 5,951,772 A | * | 9/1999 | Matsuse et al. | 118/723 R |
| 6,071,797 A | * | 6/2000 | Endo et al. | 438/488 |
| 6,326,597 B1 | * | 12/2001 | Lubomirsky et al. | 219/494 |
| 6,367,410 B1 | * | 4/2002 | Leahey et al. | 118/723 I |

* cited by examiner

Primary Examiner—Gregory Mills
Assistant Examiner—Michelle Crowell
(74) Attorney, Agent, or Firm—Tung & Associates

(57) ABSTRACT

A method for preventing contamination in a plasma process chamber when the primary heating means for the chamber is turned off is provided. In the method, a heated gas is flown over the top chamber lid of the plasma process chamber. A suitable heated gas can be nitrogen gas that is heated to a temperature between about 100° C. and about 150° C.

10 Claims, 2 Drawing Sheets

METHOD FOR PREVENTING CONTAMINATION IN A PLASMA PROCESS CHAMBER

FIELD OF THE INVENTION

The present invention generally relates to a plasma process and a chamber for conducting such process and more particularly, relates to a method for preventing particle contamination in a plasma process chamber and an apparatus for carrying out such method.

BACKGROUND OF THE INVENTION

In the fabrication of semiconductor integrated circuit (IC) devices, various device features such as insulation layers, metallization layers, passivation layers, etc., are formed on a semi-conducting substrate. It is known that the quality of an IC device fabricated is a function of the processes in which these features are formed. The yield of an IC fabrication process is in turn a function of the quality of the device fabricated and a function of the cleanliness of the manufacturing environment in which the IC device is processed.

The ever increasing trend of miniaturization of semiconductor IC devices occurring in recent years requires more stringent control of the cleanliness in the fabrication process or in the processing chamber where the process is conducted. This leads to a more stringent control of the maximum amount of impurities and contaminants that are allowed in a process chamber. When the dimension of a miniaturized device approaches the sub-half-micron level, even a minutest amount of contaminants can significantly reduce the yield of the IC manufacturing process. For instance, the yield of the process can be drastically reduced by the presence of contaminating particles during deposition or etching of films which leads to the formation of voids, dislocations or short-circuits resulting in performance and reliability problems in the IC devices fabricated.

In recent years, contamination caused by particles or films has been reduced by the improvements made in the quality of clean rooms and by the increasing utilization of automated equipment which are designed to minimize exposure to human operators. However, even though contaminants from external sources have been reduced, various contaminating particles and films are still generated inside the process chamber during the processing of semiconductor wafers. Some possible sources of contamination that have been identified include the process gases and liquids, the interior walls of the process chambers and the mechanical wear of the wafer handling equipment. The chances of generating contaminating particles are also increased in process chambers that are equipped with plasma enhancement. Various chemically reacted fragments are generated from the processing gases which include ions, electrons and radicals. These fragments can combine and form negatively charged particles which may ultimately contaminate a substrate that is being processed in the chamber. Various other materials such as polymeric films may also be coated on the process chamber walls during plasma processing. The films may dislodge and fall from the process chamber walls when subjected to mechanical and thermal stresses such that they fall onto the wafers that are being processed.

An example for illustrating chamber wall contamination is the etcher 10 shown in FIG. 1. Etcher 10 is a plasma chamber that is equipped with magnetic field enhancement generated by an upper rotating magnet 12 and a lower rotating magnet 14. The plasma etcher 10 includes a housing 16 that is typically made of a non-magnetic material such as aluminum which defines a chamber 20. A substrate holder 22 which is also a cathode is connected to a RF generator 24 which is in turn connected to a gas inlet (or showerhead) 26. The showerhead 26 also acts as an anode. A process gas 28 is supplied to chamber 20 through the gas inlet 26. A semi-conducting substrate 30 to be processed is positioned on the substrate holder or cathode 22.

The semi-conducting substrate 30 is normally held against the substrate holder 22 by a clamp ring 32. During a plasma etching process, a semi-conducting wafer 30 heats up significantly during the process and must be cooled by a cooling gas from a cooling gas supply (not shown) such that heat can be transferred to a water cooled wafer holder 36. The function of the clamp ring 32 is also to hold the substrate 30 down against the pressure generated by the cooling gas. An exhaust port 34 which is connected to a vacuum pump (not shown) evacuates the chamber. During an etching process, the upper rotating magnet 12 and the lower rotating magnet 14 function together to provide a magnetic field inside the process chamber 20.

In a conventional cleaning process for the plasma etch chamber 10, a cleaning gas supply is first flown through the gas inlet port 26 into the chamber 20 and then, the RF generator 24 is turned on. The cleaning procedure is conducted after a predetermined number, i.e. between 100–500 of wafers have been processed in chamber 20. A plasma of the cleaning gas ions is formed in the space between the showerhead 26 and the wafer holder 32 to loosen the contaminating particles and films from the chamber walls and the showerhead 26 (i.e. the upper electrode).

In an etching process for polysilicon or metal, a chlorine etching gas is frequently used. On the other hand, the etching gas used for oxide or nitride is frequently a fluorine gas. During a plasma etching process, the reactive plasma ions have a high energy level and therefore can easily combine with any available chemical fragments or elements in the chamber to form contaminating particles or films. For instance, in a metal etching process, the elements frequently seen in the etch chamber includes C, H, N, O, Al, Ti, TiN and Si. Different elements such as C, N, O, Br, Si and W are seen in a polysilicon etch chamber. The contaminating particles or films formed by often volatile chemical fragments or elements during an etching process float or suspend in the chamber due to the interaction with high energy plasma ion particles when the RF power is turned on. The phenomenon of the floating or suspended particles can be explained by the fact that the particles have higher energy and temperature while suspended in a plasma cloud. However, at the end of a conventional etching process, the RF power is switched off which leads to the sudden loss of energy in the suspended contaminating particles and causing them to fall or stick to the chamber walls or the upper electrode. This is shown in FIGS. 2A and 2B.

FIG. 2A shows a simplified etch chamber 40 equipped with a chamber cavity 42 defined by chamber walls 44. A process gas inlet 46 is used to flow a process gas into the chamber cavity 42. An upper electrode 48 and a lower electrode/wafer holder 50 are used to supply RF power to the chamber and to produce plasma ions. A gas outlet 54 is used to evacuate the process gas from the chamber cavity 42 at the end of the etching process. During the etching process, contaminating particles 52 formed as etch byproducts are buoyant and are suspended in the chamber cavity 42. A wafer 56 is supported by the wafer holder 50 for processing.

After a conventional etching process is conducted, the RF power and the heating lamps are turned off. The suspended, contaminating byproducts or particles 52 are easily deposited on chamber walls 58, upper electrode 48 and wafer 50. These contaminating particles (or films) are frequently formed of a carbon or chlorine containing polymeric material and when adhered to the chamber wall 58, are very difficult to remove. Conventionally, a wet cleaning process must be conducted after approximately 2,000–4,000 wafers have been processed in the etch chamber 40. The wet cleaning process is carried out by suing cleaning solvent such as IPA, deionized water, combination IPA/deionized water or the more volatile acetone. The wet cleaning process causes a downtime of the etcher as long as one full day.

It has been discovered that a major chamber contamination source is the polymeric material that adhered to the chamber wall during the etching process when the chamber wall is heated to at least 100° C. At the end of the etching process, the RF and the heating lamps are turned off which causes the chamber wall, i.e. specifically the top chamber wail, which is frequently formed of a quartz material to cool down rapidly below 100° C. The contraction of the polymeric based contaminating particles or films adhered to the top chamber walls causes them to peel off from the chamber wall and fall on a wafer supported in the chamber or on other chamber components causing a serious contamination problem. The cooling of the chamber walls at the end of each etching process when the heating lamps are turned off, thus becomes a major cause of chamber contamination by the polymeric based contaminating particles and films.

It is therefore an object of the present invention to provide a method for preventing contamination in a plasma process chamber that does not have the drawbacks or shortcomings of the conventional methods.

It is another object of the present invention to provide a method for preventing contamination in a plasma process chamber that can be carried out by flowing a heated gas onto the chamber wall of the process chamber after heating lamps are turned off at the end of an etching process.

It is a further object of the present invention to provide a method for preventing contamination in a plasma process chamber by heating the chamber interior to at least 80° C. by an auxiliary heating system after the main heating system of heating lamps are turned off.

It is another further object of the present invention to provide a method for preventing contamination in a plasma process chamber by turning off heating lamps and simultaneously flowing a heated gas having a temperature of at least 100° C. onto the chamber wall for preventing contaminating particles or films from falling off the chamber wall.

It is still another object of the present invention to provide a method for preventing contamination in a plasma process chamber by flowing a gas heated to a temperature between about 100° C. and about 150° C. onto an exterior surface of a top chamber wall of the process chamber.

It is yet another object of the present invention to provide a method for preventing contamination in a plasma process chamber by utilizing an auxiliary heating system for heating the chamber wall which is turned off when the temperature of the heated gas exceeds 150° C.

It is still another further object of the present invention to provide a plasma process chamber that is equipped with an auxiliary heating system for preventing chamber contamination which includes a chamber body, a primary heating system of heating lamps and an auxiliary heating system for heating gases to at least 100° C.

It is yet another further object of the present invention to provide a plasma process chamber that is equipped with an auxiliary heating system for preventing chamber contamination wherein the auxiliary heating system generates a heated gas at a temperature between about 100° C. and about 150° C. for heating the chamber wall of the process chamber such that a temperature of at least 80° C. inside the chamber is maintained.

SUMMARY OF THE INVENTION

In accordance with the present invention, a method and an apparatus for preventing contamination in a plasma process chamber such as a metal etch chamber are disclosed.

In a preferred embodiment, a method for preventing contamination in a plasma process chamber can be carried out by the operating steps of first providing a plasma process chamber that is equipped with a heating means and a top chamber wall, conducting a plasma process in the plasma process chamber and generating contaminating particles adhered to an interior surface of the top chamber wall, and turning off the heating means and simultaneously flowing a gas heated to at least 100° C. onto an exterior surface of the top chamber wall for preventing the contaminating particles from falling off the interior surface of the top chamber wall.

The method for preventing contamination in a plasma process chamber may further include the step of maintaining a temperature inside the plasma process chamber of at least 80° C. The method may further include the step of providing the heating lamps as the heating means, or the step of providing the top chamber wall in a quartz material. The method may further include the step of flowing a gas heated to a temperature between about 100° C. and about 150° C. onto an exterior surface of the top chamber wall, or the step of flowing nitrogen gas heated to at least 100° C. onto an exterior surface of the top chamber wall. The method may further include the step of dispersing the gas heated to at least 100° C. onto an exterior surface of the top chamber wall. The method may further include the step of heating the gas to at least 100° C. by an electric heating means, or heating the gas to at least 100° C. by an electric heating means and sensing the gas temperature by a temperature sensor, or the step of shutting off the electric heating means when the gas is heated to a temperature higher than 150° C.

The present invention is further directed to a plasma process chamber that is equipped with an auxiliary heating means for preventing chamber contamination which includes a chamber body equipped with a primary heating means, a top chamber wall and an auxiliary heating means mounted to the chamber body for heating the top chamber wall when the primary heating means is turned off such that a temperature inside the chamber body is at least 80° C. for preventing contaminating particles adhered to an interior surface of the top chamber wall from falling off.

The plasma process chamber equipped with an auxiliary heating means for preventing chamber contamination may further include an auxiliary heating means that generates a heated gas for heating the top chamber wall, or an auxiliary heating means that generates a heated gas having a temperature of at least 100° C. for heating the top chamber wall, or an auxiliary heating means that generated a heated gas that has a temperature between about 100° C. and about 150° C. for heating the top chamber wall. The heated gas generated by the auxiliary heating means may be a heated nitrogen. The primary heating means may be a plurality of heating lamps. The auxiliary heating means may be electric resistance heaters for heating a gas, the electric heating means may be equipped with a temperature sensor for shutting off the electric heating means when the gas heated exceeds 150° C. The plasma process chamber may be a metal etcher. The contaminating particles may be formed of a polymeric material.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method and apparatus for preventing contamination and particularly, contamination by polymeric based particles or films in a plasma process chamber.

The method can be carried out by first completing a plasma process in the process chamber, turning off a main heating means of heating lamps, and turning on an auxiliary heating means of a hot gas generator such that a gas heated to at least 100° C., and preferably between about 100° C. and about 150° C., is flown onto an exterior surface of the chamber wall of the process chamber. The flow of the hot gas enables a temperature of at least 80° C. is maintained inside the plasma chamber.

While the present invention method is applicable to any type of plasma process chamber, it is particularly suited for plasma process chambers that are equipped with a quartz cover for heating by a plurality of heating lamps positioned over the cover and assisted by a fan for blowing hot air onto the cover. The present invention novel method of blowing a hot gas onto the cover after heating lamps are turned off effectively prevents any contaminating particles or films that are adhered to an interior surface of the cover from falling off due to thermal contraction when the cover is cooled down to below 80° C. While it has been discovered that for a metal etching process, a suitable minimal temperature for the interior of the process chamber is about 80° C. for preventing polymeric films from peeling and falling off the chamber wall, any other suitable temperature can be used for preventing any type of contaminating films from falling off the chamber wall due to thermal contractions.

The present invention is further directed to a plasma process chamber that is equipped with an auxiliary heating means for preventing chamber contamination by first providing a chamber body that is equipped with a primary heating means, a top chamber wall and an auxiliary heating means. The auxiliary heating means is mounted to the chamber body for heating the top chamber wall when the primary heating means, i.e. a plurality of heating lamps, is turned off such that a temperature inside the chamber body is maintained at a minimum of at least 80° C. for preventing contaminating particles adhered on the chamber wall from falling off and contaminating a wafer positioned inside the chamber body. The auxiliary heating means may be positioned sufficient juxtaposed to the top chamber wall in a dispersing manner such that heated gas can be evenly distributed onto the top chamber wall to facilitate the heating of the plasma process chamber.

Figure 1:
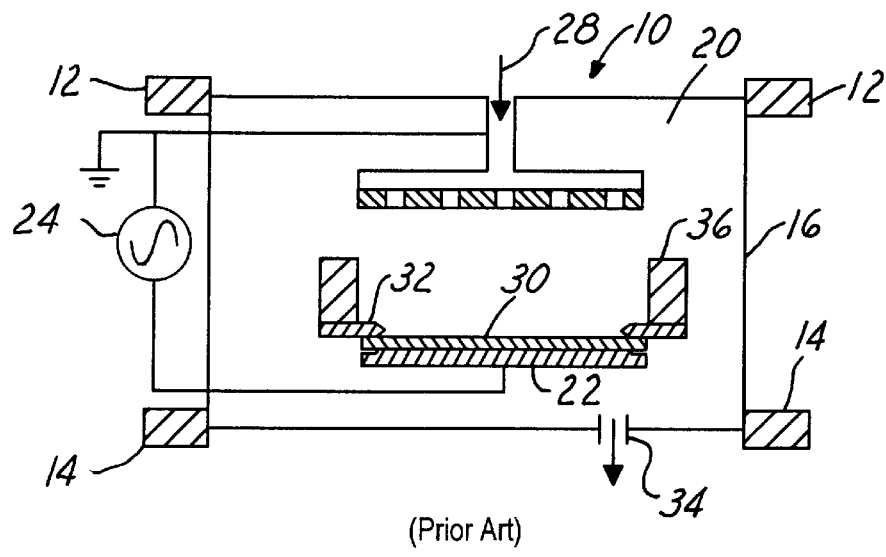
FIG. 1 is a cross-sectional view of a conventional plasma enhanced etch chamber for etching various materials such as metal, polysilicon, oxide and nitride.
Figure 2A:
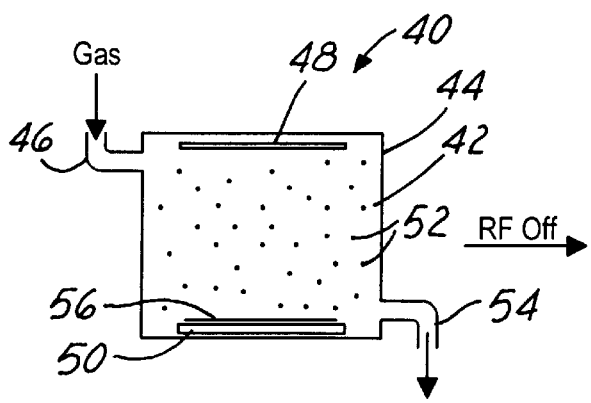
FIG. 2A is a simplified cross-sectional view of a conventional etch chamber during an etch process with the RF power on and the contaminating byproducts suspended in the chamber.
Figure 2B:
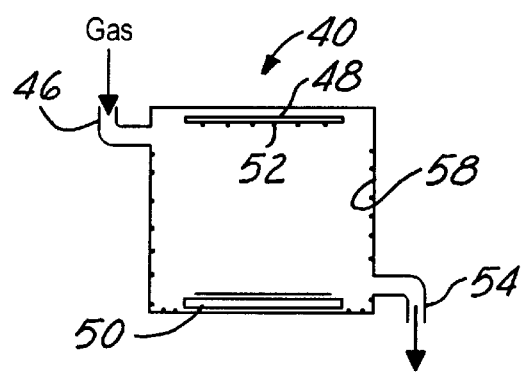
FIG. 2B is a simplified cross-sectional view of the etch chamber of FIG. 2A after the RF power and the heating lamps are turned off such that contaminating byproducts are adhered to the chamber walls.
Figure 3:
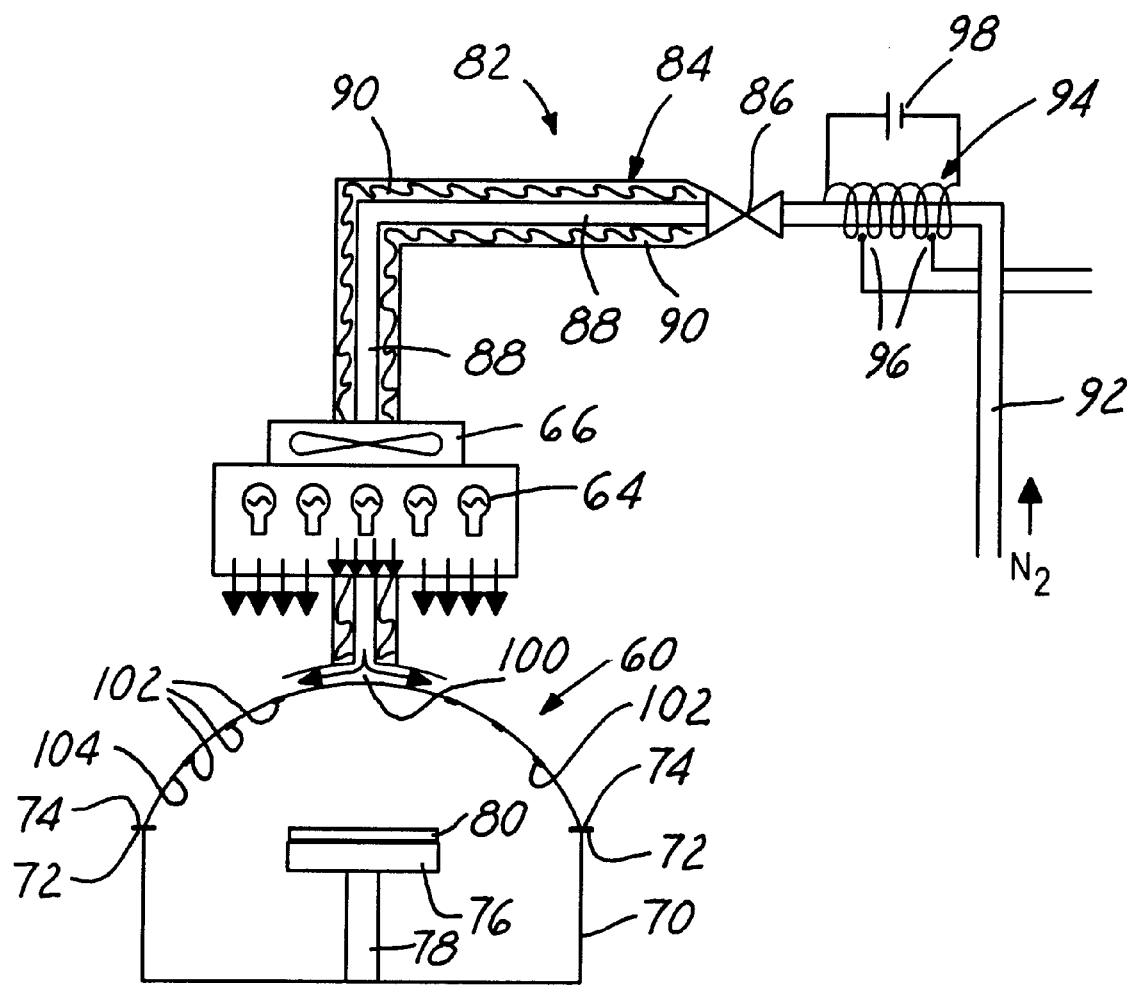
FIG. 3 is a cross-sectional view of the present invention plasma etch chamber equipped with an auxiliary heating system for flowing a heated gas onto a top chamber wall of the etch chamber after the heating lamps are turned of at the end of an etch process.

Referring now to FIG. 3 wherein a present invention plasma process chamber 60 is shown. The plasma process chamber 60 is constructed by a top chamber wall fabricated in a substantially transparent material such as quartz glass for facilitating the transmission of thermal energy emitted from a plurality of heating lamps 64 and an electric blower 66 for blowing heated air onto the top chamber wall. The plasma process chamber 60 further includes a bottom chamber wall 70 which may be moved up and down by an elevator means (not shown) such that a top flange 72 on the lower chamber wall 70 meets and seals against a c lower flange 74 on the top chamber wall. Inside the lower chamber wall 70, is positioned a wafer pedestal 76 supported on a moving shaft 78 for holding a wafer 80 thereon. At the beginning of each etching process, the moving shaft 78 moves upward to present the wafer 80 in a process position, i.e. close to the flow of etching gas and to the heating lamps 64 such that wafer 80 can be effectively heated.

The present invention auxiliary heating means 82 is a heated gas delivery means 84 controlled by a flow control valve 86. The heated gas delivery means 84 consists of an inner tube 88 for the flow of heated gas and an outer insulating layer 90 for preventing heat contained in the heated gas from escaping. The heated gas, typically a heat nitrogen gas from a factory supply line under a suitable pressure, i.e. between about 5 psi and about 200 psi pressure is fed into the supply line 92 through a heating means 94 and controlled by thermocouples 96 for feeding through the flow control valve 86 into the heated gas delivery means 84. The temperature detected by the thermocouples 96 are fed into a process controller such that the temperature of the heated gas flown through the heated gas delivery means 84 can be adjusted within a temperature range between about 100° C. and about 150° C. The heating means 94, i.e. an electric heating means is powered by an independent power supply 98 which cannot be interrupted even when there is a power failure in the fabrication facility. This ensures that there is always heated gas being delivered to the top chamber wall when the heating lamps 64 are shut off after an etching process is conducted. The heated gas supply flown through the inner tube 88 disperses at the center 100 of the top chamber wall such that the top chamber wall can be evenly heated. The dispersion can be achieved by a dispersing nozzle (not shown) or a series of tubes being fed by the inner tube 88 pointing out to various directions for dispersing a heated gas flow. Another thermal sensor (not shown) is positioned inside the heated inner tube 88 for detecting the temperature of the heated gas. When the temperature detected is over 150° C., the heating means 94 is turned off in order to prevent overheating of the top chamber wall.

The present invention auxiliary heating means 82 can be automated by utilizing the process controller for controlling the plasma process chamber 60. The flow control valve 86, the heating means 94, the thermocouples 96 and the emergency power supply 98 can be monitored by the process controller (not shown) such that the present invention auxiliary heater can function in an automated manner. For instance, when the plurality of heating lamps 64 is shut off at the end of an etching process, the flow control valve 86 is opened immediately to allow heated gas to enter the gas delivery inner tube 88 for dispersing at the center 100 of the top chamber wall such that a suitable temperature inside the process chamber can be maintained, i.e. at least 80° C. for preventing contaminating particles 102 from falling off the interior surface 104 of the top chamber wall. The nitrogen gas supply to the supply conduit 92 is normally at room temperature.

The present invention novel method and apparatus for preventing contamination in a plasma process chamber during a chamber shut-down process has therefore been amply described in the above description and in the appended drawing of FIG. 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for preventing contamination in a plasma process chamber comprising the steps of:
   providing a plasma process chamber equipped with heating means and a top chamber wall;
   conducting a plasma process in said plasma process chamber and generating contaminating particles adhered to an interior surface of said top chamber wall; and
   turning off said heating means and simultaneously flowing a gas heated to at least 100° C. onto an exterior surface of said top chamber wall for preventing said contaminating particles from falling off said interior surface of the top chamber wall.

2. A method for preventing contamination in a plasma process chamber according to claim 1 further comprising the step of maintaining a temperature inside said plasma process chamber of at least 80° C.

3. A method for preventing contamination in a plasma process chamber according to claim 1 further comprising the step of providing said heating means in heating lamps.

4. A method for preventing contamination in a plasma process chamber according to claim 1 further comprising the step of providing said top chamber wall in a quartz material.

5. A method for preventing contamination in a plasma process chamber according to claim 1 further comprising the step of flowing a gas heated to a temperature between about 100° C. and about 150° C. onto an exterior surface of said top chamber wall.

6. A method for preventing contamination in a plasma process chamber according to claim 1 further comprising the step of flowing nitrogen gas heated to at least 100° C. onto an exterior surface of said top chamber wall.

7. A method for preventing contamination in a plasma process chamber according to claim 1 further comprising the step of dispersing said gas heated to at least 100° C. onto an exterior surface of said top chamber wall.

8. A method for preventing contamination in a plasma process chamber according to claim 1 further comprising the step of heating said gas to at least 100° C. by an electric heating means.

9. A method for preventing contamination in a plasma process chamber according to claim 1 further comprising the step of heating said gas to at least 100° C. by an electric heating means and sensing said gas temperature by a temperature sensor.

10. A method for preventing contamination in a plasma process chamber according to claim 1 further comprising the step of shutting off said electric heating means when said gas is heated to a temperature higher than 150° C.

\* \* \* \* \*